(12) United States Patent
Hammedinger et al.

(10) Patent No.: US 8,456,022 B2
(45) Date of Patent: Jun. 4, 2013

(54) WELDABLE CONTACT AND METHOD FOR THE PRODUCTION THEREOF

(75) Inventors: Robert Hammedinger, Poing (DE); Konrad Kastner, Grafing (DE); Martin Maier, St. Wolfgang (DE); Michael Obesser, Bachenhausen (DE)

(73) Assignee: Epcos AG, Munich (DE)

( * ) Notice: Subject to any disclaimer, the term of this patent is extended or adjusted under 35 U.S.C. 154(b) by 145 days.

(21) Appl. No.: 11/817,554

(22) PCT Filed: Feb. 9, 2006

(86) PCT No.: PCT/EP2006/001160
§ 371 (c)(1),
(2), (4) Date: Apr. 18, 2008

(87) PCT Pub. No.: WO2006/092200
PCT Pub. Date: Sep. 8, 2006

(65) Prior Publication Data
US 2009/0020325 A1    Jan. 22, 2009

(30) Foreign Application Priority Data
Mar. 1, 2005    (DE) .......................... 10 2005 009 358

(51) Int. Cl.
*H01L 23/48*    (2006.01)
*H01L 23/52*    (2006.01)
*H01L 29/40*    (2006.01)

(52) U.S. Cl.
USPC ........... 257/779; 257/737; 257/780; 257/781; 257/786; 257/E23.023

(58) Field of Classification Search
USPC ................. 257/737, 772, 779, 780, 786, 738, 257/778, 781
See application file for complete search history.

(56) References Cited

U.S. PATENT DOCUMENTS

| | | | |
|---|---|---|---|
| 5,428,331 A | 6/1995 | Graner et al. | |
| 5,844,317 A * | 12/1998 | Bertolet et al. | 257/773 |
| 5,929,521 A * | 7/1999 | Wark et al. | 257/737 |
| 6,111,321 A | 8/2000 | Agarwala | |
| 6,255,737 B1 * | 7/2001 | Hashimoto | 257/784 |
| 6,256,170 B1 * | 7/2001 | Honda | 360/234.5 |
| 6,277,669 B1 * | 8/2001 | Kung et al. | 438/106 |
| 6,426,556 B1 * | 7/2002 | Lin | 257/738 |

(Continued)

FOREIGN PATENT DOCUMENTS

| | | |
|---|---|---|
| JP | 63-010551 | 1/1988 |
| JP | 02-278743 | 11/1990 |

(Continued)

OTHER PUBLICATIONS

English translation of Written Opinion for PCT/EP2006/001160.

(Continued)

*Primary Examiner* — Teresa M Arroyo
(74) *Attorney, Agent, or Firm* — Fish & Richardson P.C.

(57) ABSTRACT

A solderable contact for use with an electrical component includes a pad metallization on a substrate, and an under bump metallization over at least part of the pad metallization. The under bump metallization is in an area for receiving solder. The pad metallization is structured to reveal parts of the substrate surface. The under bump metallization is in direct contact with the parts of the substrate.

17 Claims, 3 Drawing Sheets

U.S. PATENT DOCUMENTS

| | | | |
|---|---|---|---|
| 6,433,426 B1* | 8/2002 | Ikegami | 257/737 |
| 6,462,426 B1* | 10/2002 | Kelkar et al. | 257/781 |
| 6,563,216 B1* | 5/2003 | Kimura et al. | 257/737 |
| 6,812,573 B2* | 11/2004 | Shimoishizaka et al. | 257/759 |
| 6,828,677 B2* | 12/2004 | Yap et al. | 257/737 |
| 6,841,872 B1* | 1/2005 | Ha et al. | 257/736 |
| 6,881,654 B2 | 4/2005 | Chen et al. | |
| 7,977,790 B2* | 7/2011 | Nagai | 257/737 |
| 2002/0105076 A1 | 8/2002 | Lin | |
| 2002/0121709 A1* | 9/2002 | Matsuki et al. | 257/786 |
| 2002/0121841 A1 | 9/2002 | Shimoe et al. | |
| 2002/0149086 A1* | 10/2002 | Aoki | 257/528 |
| 2002/0195707 A1* | 12/2002 | Bernier et al. | 257/738 |
| 2003/0011072 A1* | 1/2003 | Shinogi et al. | 257/737 |
| 2003/0141591 A1* | 7/2003 | Hsu et al. | 257/737 |
| 2003/0186072 A1* | 10/2003 | Soga et al. | 428/620 |
| 2004/0070079 A1* | 4/2004 | Huang et al. | 257/778 |
| 2004/0134974 A1* | 7/2004 | Oh et al. | 228/245 |
| 2004/0197979 A1* | 10/2004 | Jeong et al. | 438/202 |
| 2004/0206801 A1* | 10/2004 | Mis et al. | 228/180.5 |
| 2004/0245633 A1* | 12/2004 | Alter et al. | 257/738 |
| 2004/0256675 A1* | 12/2004 | McNeil | 257/355 |
| 2005/0001313 A1* | 1/2005 | Yang | 257/734 |
| 2005/0014313 A1* | 1/2005 | Workman et al. | 438/127 |
| 2005/0042790 A1* | 2/2005 | Ma | 438/51 |
| 2005/0121785 A1 | 6/2005 | Stelzl et al. | |
| 2007/0029679 A1 | 2/2007 | Selmeier et al. | |
| 2008/0169555 A1* | 7/2008 | Topacio et al. | 257/701 |
| 2009/0071710 A1 | 3/2009 | Stelzl et al. | |
| 2009/0283903 A1* | 11/2009 | Park | 257/737 |

FOREIGN PATENT DOCUMENTS

| | | | |
|---|---|---|---|
| JP | 07-094549 | | 4/1995 |
| JP | 2000-284492 | | 10/2000 |
| JP | 2001021868 A | * | 1/2001 |
| JP | 2002-261560 | | 9/2002 |
| JP | 2005-051622 | | 2/2005 |
| WO | WO03/058812 | | 7/2003 |
| WO | WO2004/066491 | | 8/2004 |

OTHER PUBLICATIONS

Written Opinion for PCT/EP2006/001160.
Search Report for PCT/EP2006/001160.
Notification of Reasons for Refusal in Japanese Application No. 2007-557354, dated Jan. 6, 2012 (English Translation).
Machine Translation of Japanese Publication No. 2000-284492 (Pub Date Oct. 2000).
English Translation of Notification of Reasons for Refusal in Japanese Application No. 2007-557354, dated Jan. 21, 2011.
Taiwanese Patent No. TW546793 (Chen) with hand written annotations (Issue Date: Aug. 11, 2003).

* cited by examiner

WELDABLE CONTACT AND METHOD FOR THE PRODUCTION THEREOF

TECHNICAL FIELD

This patent application relates to a solderable contact for an electrical component, which is used to solder the component to form an electrical connection. This patent application also describes a solderable contact for a component which has an aluminum-comprising metallization. Because aluminum cannot be soldered directly, an additional solderable coating is required on the aluminum metallization.

BACKGROUND

Solderable contacts are used, for example, for SMD components (surface mounted components) or for components mounted in a flip-chip arrangement. In the flip-chip arrangement, a chip having component structures on its surface is soldered using bumps made of solder on a carrier substrate. This has the advantage that the expense for contacting is low, that, apart from the space required for the chip on the carrier substrate, no additional surface is required for the contacting, and that the component structures are protected by the arrangement between the chip and the carrier substrate.

SAW components, which can be used, for example, as filters in cell phones, are subject, as are cell phones, to an ever-increasing demand for miniaturization. With the help of a flip-chip arrangement, SAW components can be encapsulated in a simple way by CSS plus technology developed by the applicant, in such a way that the chip size in practice determines the component size directly, and thus the CSSP package (chip sized SAW package) is produced. A possible example of such a CSS plus packaging is provided, for example, from WO03/058812.

As a result of the increasing miniaturization, it is necessary to save as much space as possible on the chip surface and to reduce the surface area of all the component structures on the surface. This has the consequence that, for example, the solderable contacts as well, and the under bump metallizations (UBM) have to become smaller. In modern components for the 9 GHz range, the UBMs have, for example, only a diameter of approximately 90 µm. However, it has been found that with these small bump diameters, the mechanical stability of the soldering sites suffers, and there is an increased risk that the soldering sites will tear loose, and thus that the component will be damaged.

SUMMARY

Described herein is a way to improve the mechanical strength of miniaturized soldering sites.

In a series of tear-off tests, the inventors have found that the problem of the deficient mechanical strength of the soldering sites does not reside in the bump itself, instead it is caused by the metallization used for the solderable contact. Tear-offs can occur particularly at the boundary surface between the UBM metallization and the underlying pad metallization.

With the solderable contact described herein, the mechanical strength of the blimp connection can be improved. This is achieved by structuring the pad metallization under the UBM metallization in such a way that the UBM metallization can lie partially on the surface of the substrate. This has the advantage that the mechanical strength is achieved both by the connection of the UBM metallization and the substrate surface, and, also, by the connection of the UBM metallization and the pad metallization. An additional advantage is that by structuring the pad metallization, the surface area on the interface is increased, which also increases the adhesion to the pad/UBM boundary surface. Moreover, mutual bracing of the structures occurs, which also increases the rigidity.

An improvement is achieved if, below the UBM metallization, a part of the pad metallization is removed, so that the UBM can lie directly on the substrate surface. However, it is advantageous if the structuring of the pad metallization is carried out in such a way that a repeatedly alternating structure is obtained, by which the interface with the UBM can be increased further.

An advantageous structuring of the pad metallization can occur in the form of a pattern having several parallel strips, between which the surface of the substrate is uncovered, or in which the superposed UBM metallization can come in contact with the chip surface. The parallel strips can be connected to each other via connection strips which run transversely to the latter surface, to improve the electrical parameters for the soldered contact.

The UBM metallization can have a multilayered structure, which has on the surface at least a layer which is wettable with solder, and, in the interior, a diffusion barrier layer. Gold is suited for the layer that is wettable with solder. It is also possible to use nickel for this layer. The diffusion barrier layer is usually a noble metal, such as one with high density, like platinum.

Another improvement of the strength in the soldering contact is achieved by using, as the lowest layer of the UBM metallization, an adhesion-promoting layer, which improves the adhesion of the UBM metallization on the substrate surface. For SAW components manufactured from lithium tantalate chips, the use of adhesion-promoting layers made of titanium is known. A solderable contact with a titanium-comprising adhesion-promoting layer directly above the structured pad metallization improves the mechanical strength of the solderable contact further.

A pad metallization can comprise, between the adhesion-promoting layer and the wettable surface, one or more additional layers, which can be generated for stress compensation particularly during or after thermal stressing of the component, and particularly of the bump connection on the solderable contact. Mechanical-thermal stresses can be compensated by such layers.

The pad metallization is structured exclusively under the UBM metallization and continuously metallized in the remaining parts. Although the desired miniaturization also requires reducing the size of the surface area occupied by the pad metallization, it [i.e. the area of the pad metallization] is usually still greater than the UBM metallization, particularly if the pad metallization is configured in a rectangular shape, while the UBM metallization, in contrast, is round or oval, corresponding to the desired bump cross section. The pad metallization then has a round or oval structured area, on which the UBM metallization lies.

The pad metallization itself can be configured in a known conventional design. A standard metallization has, for example, a layer of aluminum or an aluminum-containing alloy, and can be configured as a single layer. In the multilayered embodiment, the pad metallization can also contain additional layers, in addition to such a layer, and particularly layers which are harder than aluminum, particularly copper layers. A structure for a pad metallization may have, for example, an aluminum/copper/aluminum layer sequence. In addition, it is, of course, also possible for adhesion-promoting layers, particularly those made of titanium, to be provided under the pad metallization.

Embodiments will be explained in detail below with reference to associated figures. The figures are intended only for illustration and therefore they are merely schematic and not true to scale. Identical parts, or parts with the same function, bear the same reference numerals.

DETAILED DESCRIPTION

Figure 1A:
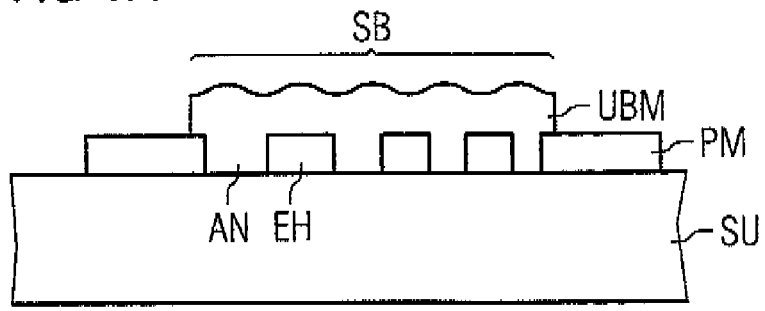
FIG. 1 shows a solderable contact on a substrate.
Figure 1B:
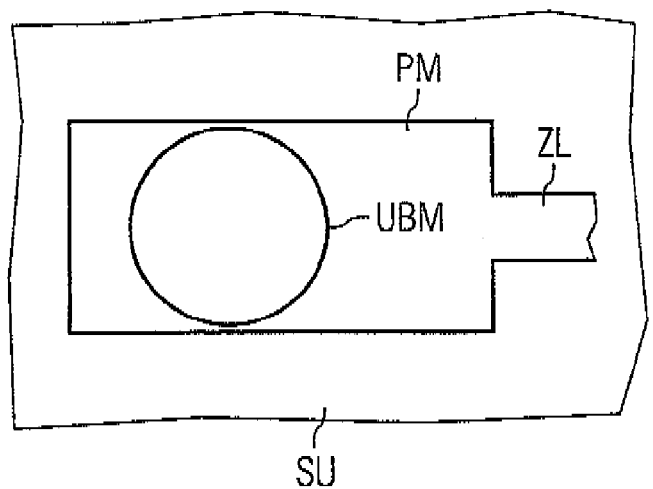

FIG. 1 shows a solderable contact on a substrate in a schematic cross section (FIG. 1a) or in top view (FIG. 1b). The solderable contact, which is applied on the substrate SU, such as a semiconductor substrate or a piezoelectric substrate, comprises a pad metallization PM which is applied directly on the substrate, and a UBM metallization UBM which is applied on the pad metallization. The pad metallization PM has a structured area SB, which is structured with elevations EH and recesses AN, with the surface of the substrate SU uncovered in the recesses AN. The pad metallization is a conventional metallization, as also used for the manufacture of electrically conductive structures on the surface of components, and as produced particularly together with these electrically conductive structures, which may be the same structure. The UBM metallization is applied at least in the structured area SB, and comes in contact in the recesses AN with the surface of the substrate SU. It is also possible for the UBM metallization to have a smaller surface area, or a larger surface area than the structured area SB.

FIG. 1b shows the solderable contact in a top view. The pad metallization is a flat metallization, which can be connected via a supply line ZL, shown only in sections, to electrically conductive structures of a component. It is also possible for the electrical contacting of the pad metallization PM with active component structures to occur from below through the substrate, so that the electrical connection of the pad metallization occurs, for example, by plated through-hole through the substrate, or at least through an upper substrate layer. The UBM metallization covers the structured area SB completely in the depicted embodiment.

Figure 2A:
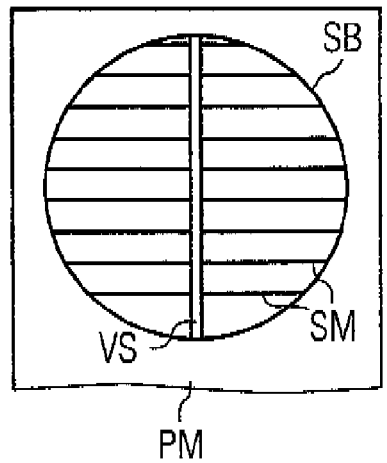
FIG. 2 shows a structured pad metallization in the top view.
Figure 2B:
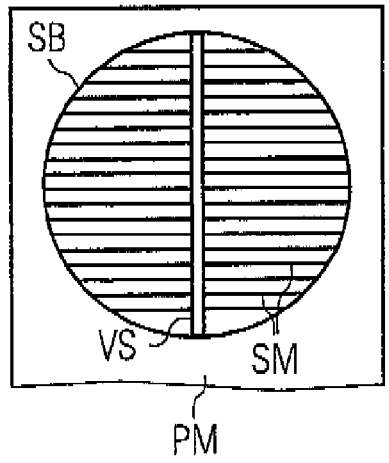

FIG. 2 shows possible structures of the pad metallization PM in the top view, where, in FIG. 2a a smaller number of structures is represented, and, in FIG. 2b a higher metallization density is represented, i.e., a higher portion of the surface within the structured area SB is covered by pad metallization. In both cases, the structuring of the pad metallization includes a row of parallel strip-shaped recesses AN, which are separated from each other by a corresponding striped pattern SM of metallization (elevations). A connection strip VS, which connects the striped pattern SM, runs diagonally to the striped pattern, where the connecting strip VS, as show, can have a slightly greater width than the striped pattern SM. The striped pattern here is connected by all its external ends to the remaining pad metallization PM in an electrically conductive connection, so that as a result the electrical series resistance of the soldered contact is kept low.

The surface portion of the pad metallization in the structured area SB is a function of the desired electrical values and the electrical contact required for that purpose, from the striped pattern SM, the connection strips VS, and the UBM metallization located above the latter, but not shown in the figure. If a larger portion of metal surface is required, then either the density of the striped pattern SM or the number of the individual strips is increased, as represented, for example, in FIG. 2b.

However, any structuring in the structured area SB is possible. The represented structuring types, however, have the advantage that they can be structured in a simple manner with a stepper, for example, by structuring a lift-off lacquer and by carrying out a lift-off technique. A resulting additional advantage is that the straight structures chosen for the striped pattern SM can be structured by a lift-off technique. Above such structures, the lift-off layer with the area of the metallization located above it can be lifted. The metallization thickness and the type of the pattern are chosen as a function of the diameter of the UBM, where, as the UBM decreases, a higher metallization portion can be advantageous. However, for reasons pertaining to a simpler type of structuring, this cannot be achieved by additional strips in the striped pattern. Instead it is achieved by broader strips. Above the connection strips VS, a better electrical contact is established between all the strips of the striped pattern, which reduces the electrical resistance, and leads to a better electrical contact between the pad metallization and the UBM.

FIG. 3 shows the manufacture of a solderable contact in schematic cross sections.

First, a layer of a lift-off lacquer is applied onto to the surface of a substrate SU, over the entire surface, and structured to form a first lift-off mask AM1. The structuring is carried out in such a way that, in the areas intended for the metallization, the surface of the substrate SU is uncovered.

Figure 3A:
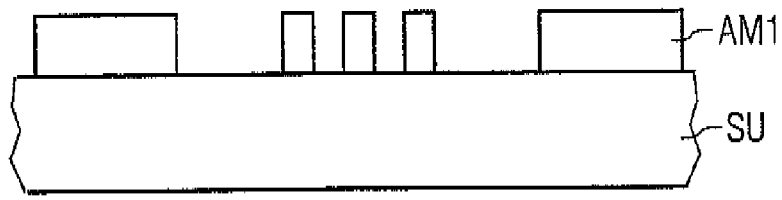
FIG. 3 shows different process steps in the manufacture of a solderable contact.
Figure 3B:

Next, a layer PMS for the pad metallization is applied over the first lift-off mask AM1, over the entire surface. The pad metallization can also comprise several layers, and therefore be applied in several successive steps. The individual layers may be applied by vapor deposition. FIG. 3b shows the arrangement.

Figure 3C:
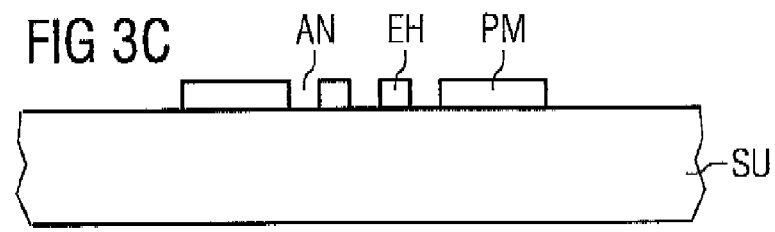

FIG. 3c shows the finished pad metallization PM, which is produced by the lift-off of the first lift-off mask AM1 together with the portions of the metal layer PMS applied on top of it, for the pad metallization. In the central area, the pad metallization PM has a structuring comprising elevations EH and recesses AN.

Figure 3D:
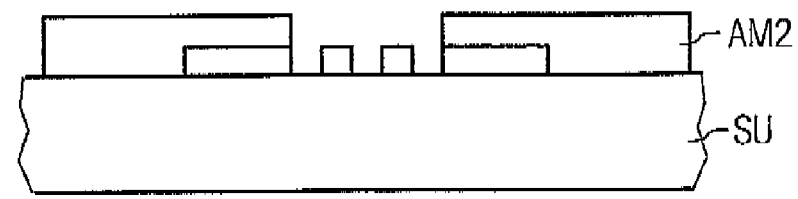

Next, a second lift-off mask AM2 is produced by the application to the entire surface, and by the structuring, of a peel layer. In the area of the UBM metallization, the lift-off layer is removed. FIG. 3d shows the arrangement.

Figure 3E:

FIG. 3e shows the arrangement after the application to the entire surface of a UBMS layer for the UBM metallization.

Figure 3F:
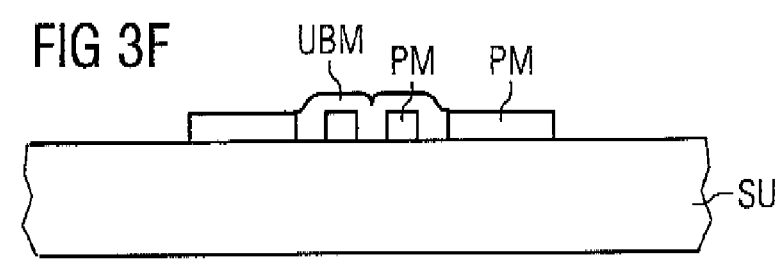

FIG. 3f: next, the lift-off peel mask AM2 together with the portion of the metal layer UBMS lying over it, for the UBM metallization, is peeled off, whereby the finished solderable contact is produced.

Figure 4:
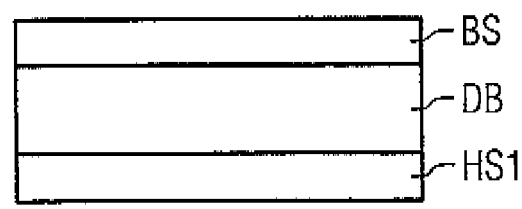
FIG. 4 shows a layered structure for a UBM metallization in a schematic cross section.

The UBM metallization as well is constructed from several layers. FIG. 4 shows a possible layer structure for the UBM metallization UBM. As the lowermost layer, which adheres well to the substrate SU, an adhesion-promoting layer HS1 may be used. The uppermost layer of the UBM metallization is a layer BS which can be wetted by solder, while a diffusion barrier layer DB, arranged therebetween, prevents undesired diffusion of metals in or under the contact, and particularly into the substrate SU. Diffusion can occur out of the wettable layer BS or out of an alloy of the solder and the material of the wetting layer BS, which alloy is produced by the soldering process.

For a UBM metallization that is to be applied to piezoelectric material and particularly to substrates made of lithium tantalate, a suitable layer structure, which is mentioned only as an example, includes a first adhesion-promoting layer HS1 comprised of 100 nm titanium, a diffusion barrier layer DB comprised of 200 nm platinum, and a wetting layer BS comprised of 100 nm gold. For other substrates, other materials can also be chosen for the adhesion-promoting layer. Other heavy metals are suitable for the diffusion barrier. For the wetting layer BS, gold may be used as the solution, however, it can be replaced by nickel, if the UBM is processed rapidly or soldered rapidly.

Figure 5:
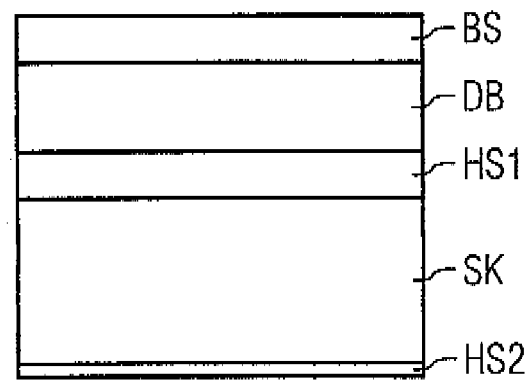
FIG. 5 shows an additional layered structure for a UBM metallization.

FIG. 5 shows an additional exemplary embodiment for a UBM metallization, which includes a second adhesion-promoting layer HS2, a stress compensation layer SK, a first adhesion-promoting layer HS1, as well as the diffusion barrier layer DB and the wetting layer BS. The stress compensation layer SK can serve to receive and compensate for a large portion of the stresses that occur during the production of a soldering site on the UBM, and particularly during the soldering of the component to, for example, a carrier. This is achieved by an appropriately high layer density and by appropriate selection of the metal for the stress compensation layer via its E modulus and its thermal expansion coefficients. A UBM metallization that is suitable for a UBM on lithium tantalate substrates comprises, for example, 30 nm titanium as second adhesion-promoting layer HS2, 400 nm aluminum as stress compensation layer SK, 100 nm titanium as first adhesion-promoting layer at HS1, 200 nm platinum as diffusion barrier layer DB, as well as 100 nm gold as wetting layer BS.

The solderable contact described herein is suited for components whose electrically conductive component structures are arranged on the surface of a substrate, and produced and structured together with the pads. The solderable contact is therefore advantageous for components that operate with acoustic waves, particularly for components that operate with surface acoustic waves, SAW components, or FBAR resonators that operate with bulk waves. However, with the indicated solderable contact, as well as with all other substrate materials, an improved adhesion of the contact to the substrate is achieved, as is an improved composite material made from the pad metallization and the UBM metallization, which leads to an improved soldering site by which the solderable contact is connected electrically and mechanically to an external environment. As a result, the reliability of the corresponding component and thus its useful lifetime are also increased.

The claims are not limited to the indicated examples. In particular, with regard to the materials used, the structures indicated, and the corresponding layer thicknesses, many variations are possible within the scope of the claims, not all of which, however, are described in detail here.

The invention claimed is:

1. A solderable contact for use with an electrical component, the solderable contact comprising:
    a pad metallization on a substrate, the pad metallization having a lateral extent; and
    an under bump metallization over at least part of the pad metallization, the under bump metallization comprising an area for receiving solder;
    wherein the pad metallization is structured to form mesas and recesses among the mesas that reveal parts of a surface of the substrate within the lateral extent of the pad metallization, the under bump metallization being in direct contact with part of the substrate in at least one of the recesses, the under bump metallization being in direct contact across a surface of the at least one of the recesses that extends from one mesa to another mesa, the mesas forming a symmetric pattern.

2. The solderable contact of claim 1, wherein the pad metallization below the under bump metallization is structured to form substantially parallel strips of pad metallization.

3. The solderable contact of claim 1, wherein the under bump metallization comprises a multilayered structure, the multilayered structure comprising at least one wettable layer and a diffusion barrier layer.

4. The solderable contact of claim 3, wherein the multilayered structure comprises an additional layer, the additional layer comprising at least one of a stress compensation layer and an adhesion-promoting layer.

5. The solderable contact of claim 3, wherein the multilayered structure comprises at least one titanium-comprising adhesion-promoting layer, a Pt-comprising diffusion barrier layer, and a gold-comprising wettable layer.

6. The solderable contact of claim 1, wherein a structured area of the pad metallization corresponds approximately to an area of the under bump metallization; and
    wherein the pad metallization in an area other than the structured area comprises a substantially continuous and unstructured pad metallization.

7. The solderable contact of claim 1, wherein the pad metallization comprises a layer comprised of aluminum or an aluminum-containing alloy, or a multilayered structure comprising a layer comprised of aluminum or an aluminum-containing alloy together with an additional layer.

8. The solderable contact of claim 1, further comprising:
    a layer below the pad metallization, the layer comprising a titanium-comprising adhesion-promoting layer.

9. The solderable contact of claim 1, wherein the under bump metallization comprises a multilayered structure, the multilayered structure comprising at least one wettable layer.

10. The solderable contact of claim 9, wherein the multilayered structure comprises an additional layer, the additional layer comprising at least one of a stress compensation layer and an adhesion-promoting layer.

11. The solderable contact of claim 10, wherein the multilayered structure comprises at least one titanium-comprising adhesion-promoting layer, a Pt-comprising diffusion barrier layer, and a gold-comprising wettable layer.

12. The solderable contact of claim 11, wherein a structured area of the pad metallization corresponds approximately to an area of the under bump metallization; and
    wherein the pad metallization in an area other than the structured area comprises a substantially continuous and unstructured pad metallization.

13. The solderable contact of claim 12, wherein the pad metallization comprises a layer comprised of aluminum or an aluminum-containing alloy, or a multilayered structure comprising a layer comprised of aluminum or an aluminum-containing alloy together with an additional layer.

14. The solderable contact of claim 13, further comprising:
    a layer below the pad metallization, the layer below the pad metallization comprising a titanium-comprising adhesion-promoting layer.

15. An apparatus comprising:
    a solderable contact comprising:
        a pad metallization on a substrate, the pad metallization having a lateral extent; and
        an under bump metallization over at least part of the pad metallization, the under bump metallization comprising an area for receiving solder;
        wherein the pad metallization is structured to produce mesas and recesses among the mesas that reveal parts of a surface of the substrate within the lateral extent of the pad metallization, the under bump metallization being in direct contact with part of the substrate in at least one of the recesses, the under bump metallization being in direct contact across a surface of the at least one of the recesses that extends from one mesa to another mesa, the mesas forming a symmetric pattern; and a surface acoustic wave component that is connected to the solderable contact.

16. The apparatus of claim 15, wherein the pad metallization comprises a layer comprised of aluminum or an aluminum-containing alloy, or a multilayered structure comprising a layer comprised of aluminum or an aluminum-containing alloy together with an additional layer.

17. The apparatus of claim 15, wherein the pad metallization below the under bump metallization is structured to form substantially parallel strips of pad metallization.

* * * * *